United States Patent
Taji et al.

(10) Patent No.: US 6,307,616 B1
(45) Date of Patent: *Oct. 23, 2001

(54) EXPOSURE APPARATUS AND SUBSTRATE HANDLING SYSTEM THEREFOR

(75) Inventors: Kenichiro Taji; Noriaki Murata, both of Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/925,137

(22) Filed: Sep. 8, 1997

(30) Foreign Application Priority Data

Sep. 9, 1996 (JP) .................................................... 8-257365
Sep. 19, 1996 (JP) .................................................... 8-267731

(51) Int. Cl.$^7$ ........................... G03B 27/42; G03B 27/62; G03B 27/60; G03B 27/64

(52) U.S. Cl. ................................. 355/53; 355/76; 355/73; 355/75

(58) Field of Search ................................. 355/53, 86, 89, 355/91, 95, 73, 98, 76; 430/22, 23; 378/34, 208; 414/416; 356/401

(56) References Cited

U.S. PATENT DOCUMENTS

| 5,194,893 | | 3/1993 | Nishi . | |
| 5,281,996 | | 1/1994 | Bruning et al. . | |
| 5,471,279 | * | 11/1995 | Takizawa | 355/73 |
| 5,498,118 | * | 3/1996 | Nakahara | 414/416 |
| 5,715,064 | * | 2/1998 | Lin | 356/401 |
| 5,858,587 | * | 1/1999 | Yamane et al. | 430/22 |
| 5,883,932 | * | 3/1999 | Chiba et al. | 378/34 |

* cited by examiner

Primary Examiner—David M. Gray
Assistant Examiner—Peter B. Kim
(74) Attorney, Agent, or Firm—Fitzpatrick, Cella, Harper & Scinto

(57) ABSTRACT

A substrate handling method includes a first step for holding a substrate with a hand mechanism, the hand mechanism being provided for positioning the substrate, a second step for discharging a gas out of a gas pad provided on a stage, such that the substrate held by the hand mechanism is floated relative to the gas pad, wherein the hand mechanism is provided separately from the stage, a third step for moving the hand mechanism such that the substrate is positioned finely with respect to the plane of the substrate and a fourth step for stopping gas discharging from the gas pad.

19 Claims, 10 Drawing Sheets

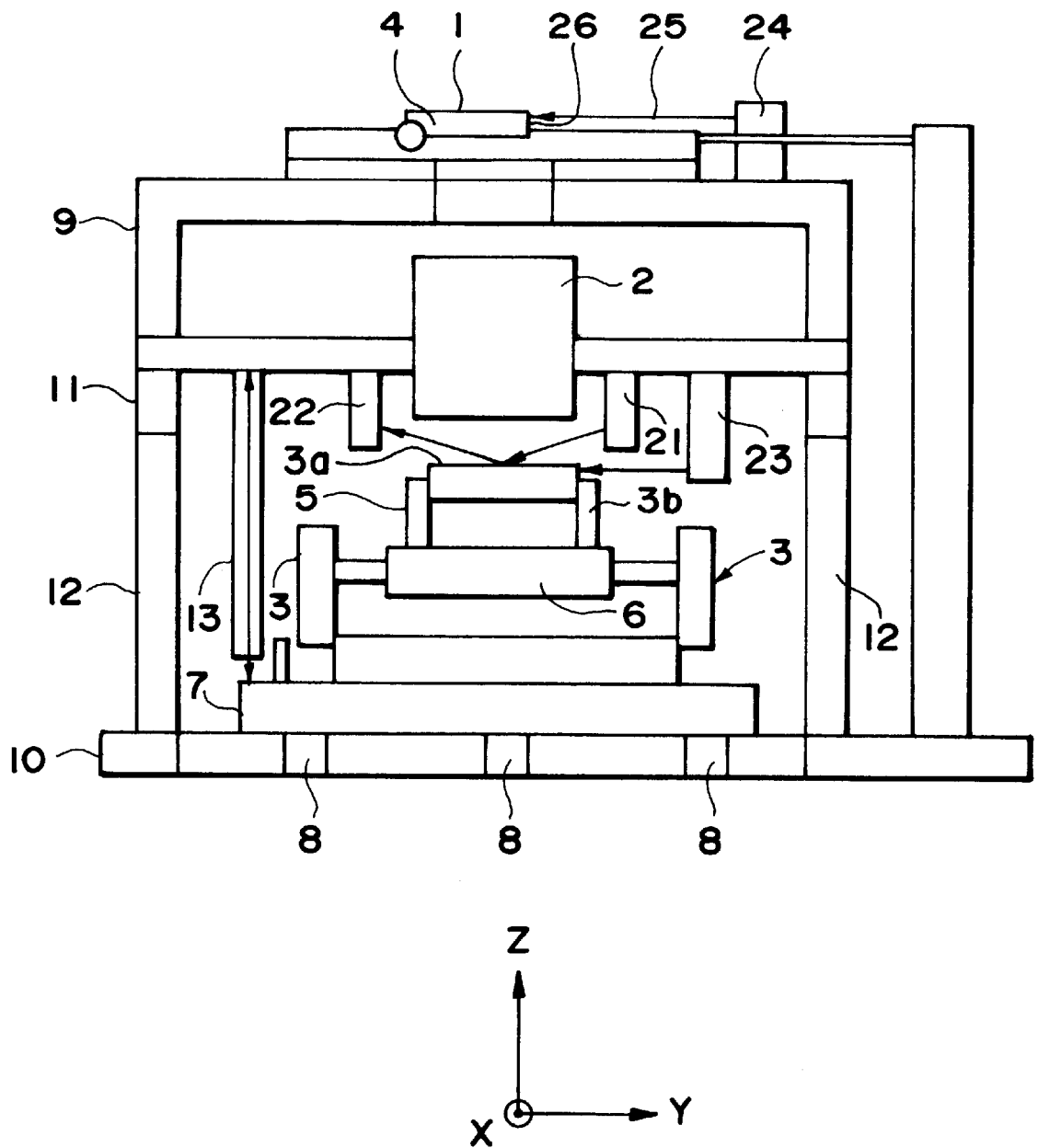
F I G. 1

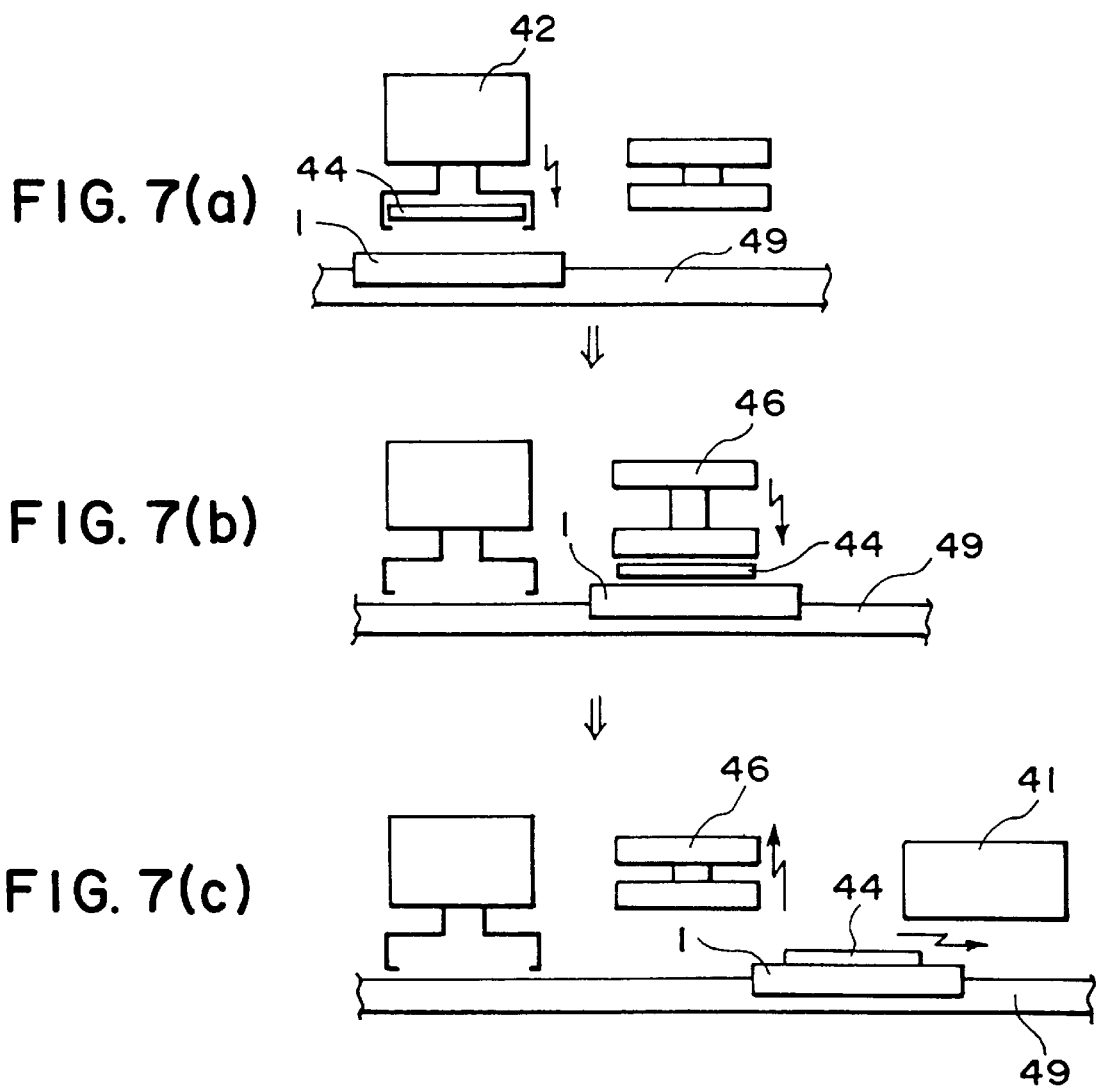

EXPOSURE APPARATUS AND SUBSTRATE HANDLING SYSTEM THEREFOR

FIELD OF THE INVENTION AND RELATED ART

This invention relates to an exposure apparatus for the manufacture of microdevices such as, for example, semiconductor devices (e.g., ICs or LSIs), liquid crystal devices, image pickup devices (e.g., CCDs), or magnetic heads. More particularly, the invention is directed to an exposure apparatus with an original holding stage which is lightened in weight to increase the throughput of the apparatus.

In an exposure apparatus according a simultaneous exposure method, if a projection optical system is provided by lenses, the imaging region thereof has a circular shape. However, since a semiconductor integrated circuit is generally of a rectangular shape, the pattern transfer region in the case of the simultaneous exposure method has to be of a rectangular shape inscribed with the circular imaging region of the projection optical system. Thus, even the largest pattern transfer region is of a square shape with a side $1/\sqrt{2}$ of the diameter of the circle.

On the other hand, there has been proposed a scan exposure method (step-and-scan method) wherein a slit-like exposure region of a size approximately corresponding to the diameter of a circular imaging region of a projection optical system is used and wherein a reticle and a wafer are scanningly moved in synchronism with each other, whereby the pattern transfer region is enlarged. In this method, with a projection optical system having an imaging region of the same size, a larger pattern transfer region can be attained as compared with the step-and-repeat method wherein for each pattern transfer region the simultaneous exposure is performed by use of a projection lens. More specifically, with respect to the scan direction there is no limitation by the optical system and, therefore, a pattern transfer region corresponding to the stroke of the stage can be provided. Also, with respect to a direction perpendicular to the scan direction, a pattern transfer region of about 2 times larger can be provided.

In exposure apparatuses for the manufacture of semiconductor integrated circuits, enlargement of the pattern transfer region and improvement of resolution are desired to meet production of larger capacity chips. The capability of using a smaller projection optical system is advantageous with respect to optical performance and cost. Thus, the step-and-scan exposure method is very attractive.

In such a step-and-scan exposure apparatus, it is necessary to assure high precision registration of a reticle and a wafer. For example, a reticle placed on a reticle stage in response to reticle replacement is observed through a reticle alignment scope, and the position of the reticle with respect to a reference mark provided on the reticle stage is measured precisely. Regarding this reticle scope, the measurement range becomes narrower with higher measurement precision. For example, the measurement range of a reticle alignment scope in an exposure apparatus suitable to production of 256M devices will have a size of about 2 microns square.

With a conventional reticle hand mechanism, it is very difficult to place a reticle on a reticle stage with a precision (error) of about 2 microns. Thus, it may be possible to provide an X-Y-θ fine motion mechanism on the reticle stage and, while changing the reticle alignment scope magnification to a lower magnification, to reduce the positional error of the reticle within the range of 2 microns. However, if such an X-Y-θ fine motion mechanism is mounted on the reticle stage, the reticle stage becomes heavy. Particularly, for an exposure apparatus of a scan type wherein a reticle is to be scanningly moved, the movement speed of the stage becomes lower, which causes reduction of throughput. Further, the weight of the reticle stage may cause flexure of a stage base, causing degradation of exposure precision.

SUMMARY OF THE INVENTION

It is an object of the present invention to provide an exposure apparatus which is free from the problems described above.

It is another object of the present invention to provide a substrate handling method suitably usable in a scan type exposure apparatus, for example, by which at least one of the inconveniences described above can be removed.

It is a further object of the present invention to provide a substrate handling system suitably usable in a scan type exposure apparatus, for example, by which at least one of the inconveniences described above can be removed.

It is a yet further object of the present invention to provide a device manufacturing method based on such a scanning exposure apparatus as described above.

In accordance with an aspect of the present invention, there is provided a substrate handling method, comprising: a first step for holding a substrate with a hand mechanism; a second step for discharging a gas out of a gas pad provided on a stage, such that the substrate held by the hand mechanism is floated by a small amount relative to the gas pad; a third step for moving the hand mechanism such that the substrate is positioned finely with respect to the plane of the substrate; and a fourth step for stopping gas discharging from the gas pad.

In accordance with another aspect of the present invention, there is provided a substrate handling system, comprising: a hand mechanism for holding a substrate; and a gas pad provided on a stage and being adapted to hold a substrate with suction of gas, said gas pad further being adapted to provide gas suction and gas discharging interchangeably.

In accordance with a further aspect of the present invention, there is provided a substrate handling system, comprising: a hand mechanism for holding a substrate; and a gas pad provided on a stage and being adapted to hold a substrate with attraction through suction of gas; said hand mechanism being adapted to position the substrate finely, held by said hand mechanism, upon said gas pad and with respect to the plane of the substrate.

In accordance with a yet further aspect of the present invention, there is provided a device manufacturing method for manufacturing a device with an exposure process including a substrate holding method as recited above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and side view of an exposure apparatus according to an embodiment of the present invention.

FIGS. 7(a), 7(b), and 7(c) are schematic views for explaining reticle replacement and alignment procedure in the exposure apparatus of the FIG. 1 embodiment.

DESCRIPTION OF THE PREFERRED EMBODIMENTS

Preferred embodiments of the present invention will be described with reference to the drawings.

[Embodiment 1]

Figure 2:
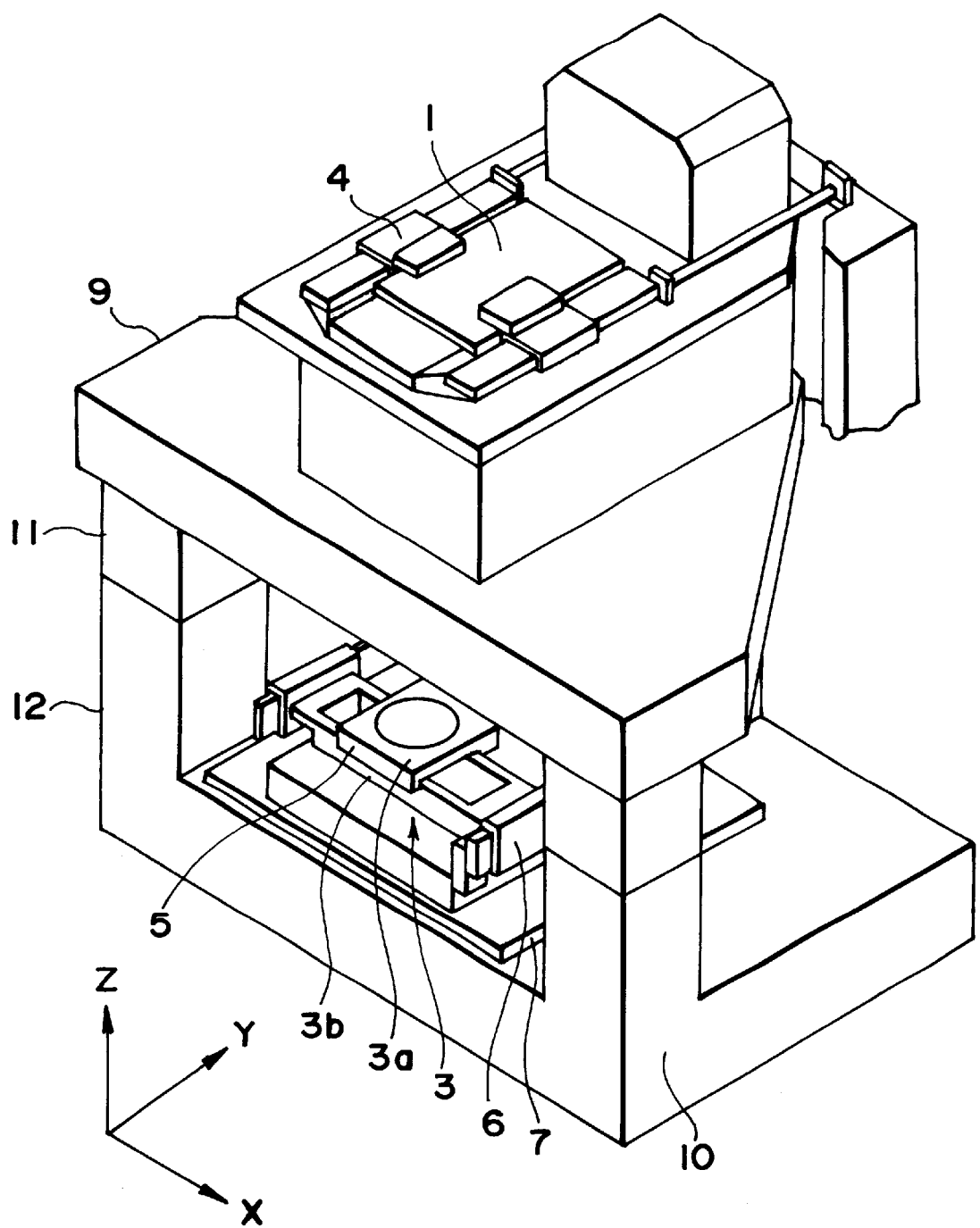
FIG. 2 is a schematic and perspective view of the exposure apparatus of the FIG. 1 embodiment.

FIG. 1 is a schematic and side view of an exposure apparatus according to an embodiment of the present invention. FIG. 2 is a perspective view of the apparatus. As shown in these drawings, the exposure apparatus comprises a step-and-scan type exposure apparatus wherein a portion of a pattern of an original placed on a reticle stage 1 is projected onto a wafer placed on a wafer stage 3 through a projection optical system 2, wherein the reticle and the wafer are relatively and scanningly moved in synchronism with each other in the Y direction relative to the projection optical system 2, whereby the pattern of the reticle is transferred to the wafer, and wherein there is stepwise motion interposed to repeat the scan exposure to plural transfer regions (shots) on the wafer.

The reticle stage 1 can be moved in the Y direction by a linear motor 4. The wafer stage 3 comprises an X stage 3a which can be moved in the X direction by a linear motor 5. The wafer stage further comprises a Y stage 3b which can be moved in the Y direction by a linear motor 6. Synchronized scan of the reticle and the wafer is performed by moving the reticle stage 1 and the Y stage 3b in Y direction at a predetermined speed ratio (e.g., 4:−1 where the sign "−" represents that the direction is inverse). Stepwise motion in the X direction is provided by the X stage 3a. On the X stage 3a, there is a Z-tilt stage (not shown) mounted. A wafer chuck, not shown, for holding the wafer is mounted on the Z-tilt stage.

The wafer stage 3 is mounted on the stage base 7 which is supported by the floor, for example, at three points and through three dampers 8. The reticle stage 1 and the projection optical system 2 are mounted on a barrel base 9 which is supported by a base frame 10 mounted on the floor, for example, through three dampers 11 and pillars 12. Each damper 8 comprises an active damper for active vibration control or vibration isolation in six-axis directions. However, it may comprise a passive damper. Alternatively, the mechanism may be supported without such a damper.

The exposure apparatus further includes distance measuring means 13 such as a laser interferometer or microencoder, for example, which is adapted to measure the distance between the barrel base 9 and the stage base 7 at three points.

Light projecting means 21 and light receiving means 22 provide a focus sensor for detecting whether a wafer on the wafer stage 3 is placed on the focus plane of the projection optical system 2 or not. More specifically, the light projecting means 21 fixed to the barrel base 9 projects light onto the wafer in an oblique direction, and the light receiving means 22 detects the position of reflection light from the wafer to thereby detect the position of the wafer surface with respect to the optical axis direction of the projection optical system 2.

In the apparatus of FIG. 1, light emitted by a laser interferometer light source (not shown) is introduced into a Y-direction laser interferometer 24 for the reticle stage. The light entering the laser interferometer 24 is divided by a beam splitter (not shown) within the interferometer 24 into light to be directed to a fixed mirror (not shown) of the interferometer and light to be directed to a Y-direction movement mirror 26. The light directed to the Y-direction movement mirror 26 goes along a Y-direction measurement path 25 and impinges on the Y-direction movement mirror 26 fixed on the reticle stage 4. Here, light reflected thereby goes back along the Y-direction measurement path 26, back to the beam splitter of the laser interferometer, by which it is superposed on the light, reflected by the fixed mirror, one upon another. By detecting a change in interference of light, movement distance in the Y direction can be measured. Movement distance information thus obtained is fed back to a scan control device, not shown, whereby positioning control of the scan position of the reticle stage is performed. Similarly, for the Y stage 3b, positioning control of the scan position is provided on the basis of the result of measurement made by a Y-direction laser interferometer 23 for the wafer stage.

In operation with the structure described above, by use of conveying means (not shown) a wafer a is conveyed along a conveyance path between two pillars 12 in the front portion of the apparatus. After completion of a predetermined alignment operation, the exposure apparatus performs printing of the pattern of the reticle onto plural transfer regions on the wafer while repeating scan exposure and stepwise motion. With regard to the scan exposure, the reticle stage 1 and the Y stage 3b are moved in the Y direction (scan direction) at a predetermined speed ratio so that the pattern of the reticle is scanned with slit-like exposure light, and also the wafer is scanned with the projected image thereof. By this, the pattern of the reticle is transferred and printed onto a particular exposure region on the wafer. During the scan exposure process, the height (level) of the wafer surface is measured by the focus sensor described above, and, on the basis of the measured value, the height and tilt of the wafer stage 3 are real-time controlled to execute focus correction. After scan exposure of one exposure region is completed, the X stage 3a is driven to move the wafer stepwise in the X direction to thereby place another exposure region at the scan exposure start position. Then, the scan exposure is performed. The layout of exposure regions, the scan direction (positive or negative) and the order of exposures for the exposure regions, for example, are so determined that, with the combination of stepwise motion in the X direction and movement in the Y direction for scan exposure, exposures can be done efficiently to plural exposure regions on the wafer.

Figure 3:
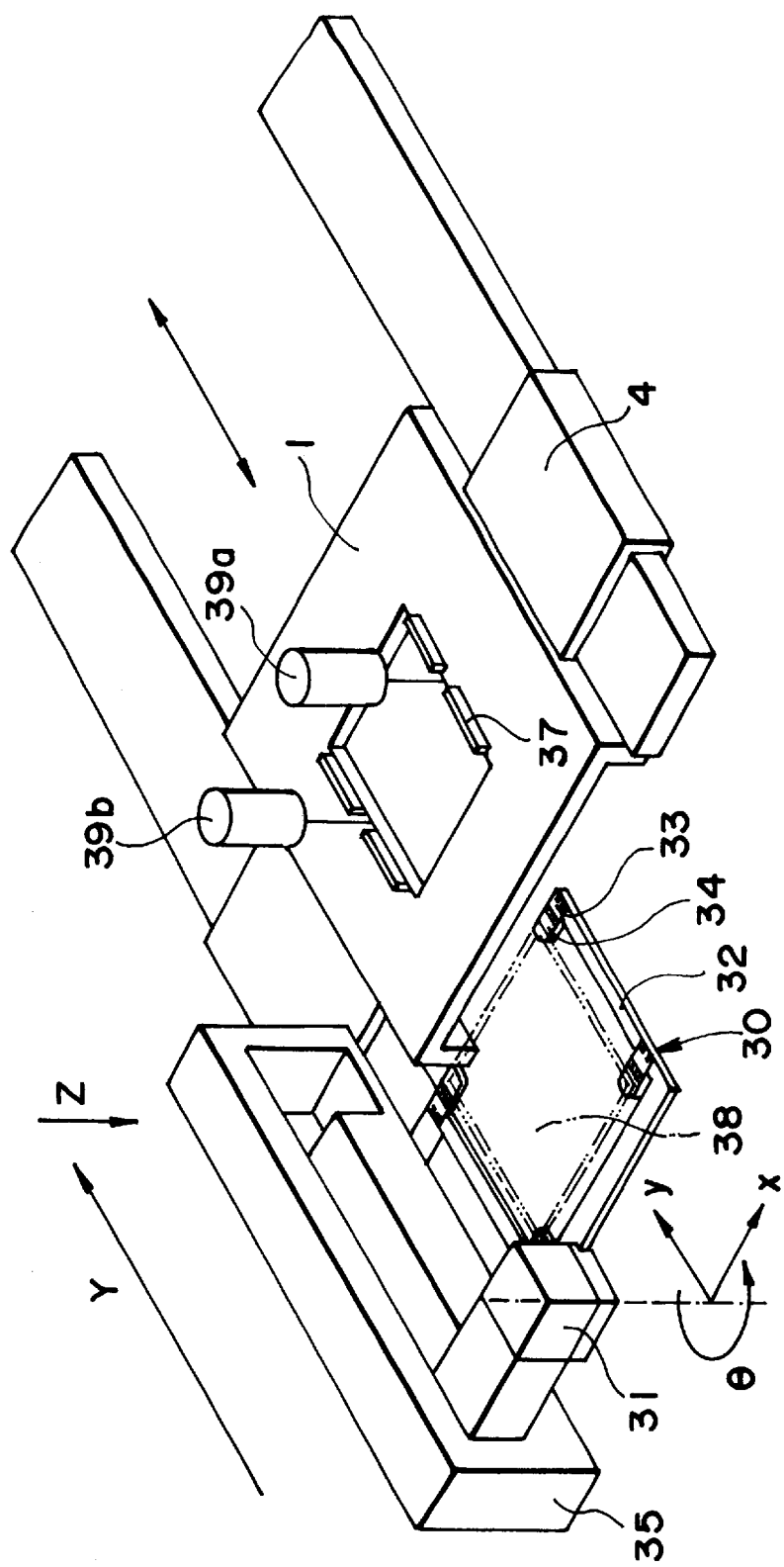
FIG. 3 is a schematic and perspective view for explaining the structure of an exposure stage and a conveying hand mechanism.
Figure 4:
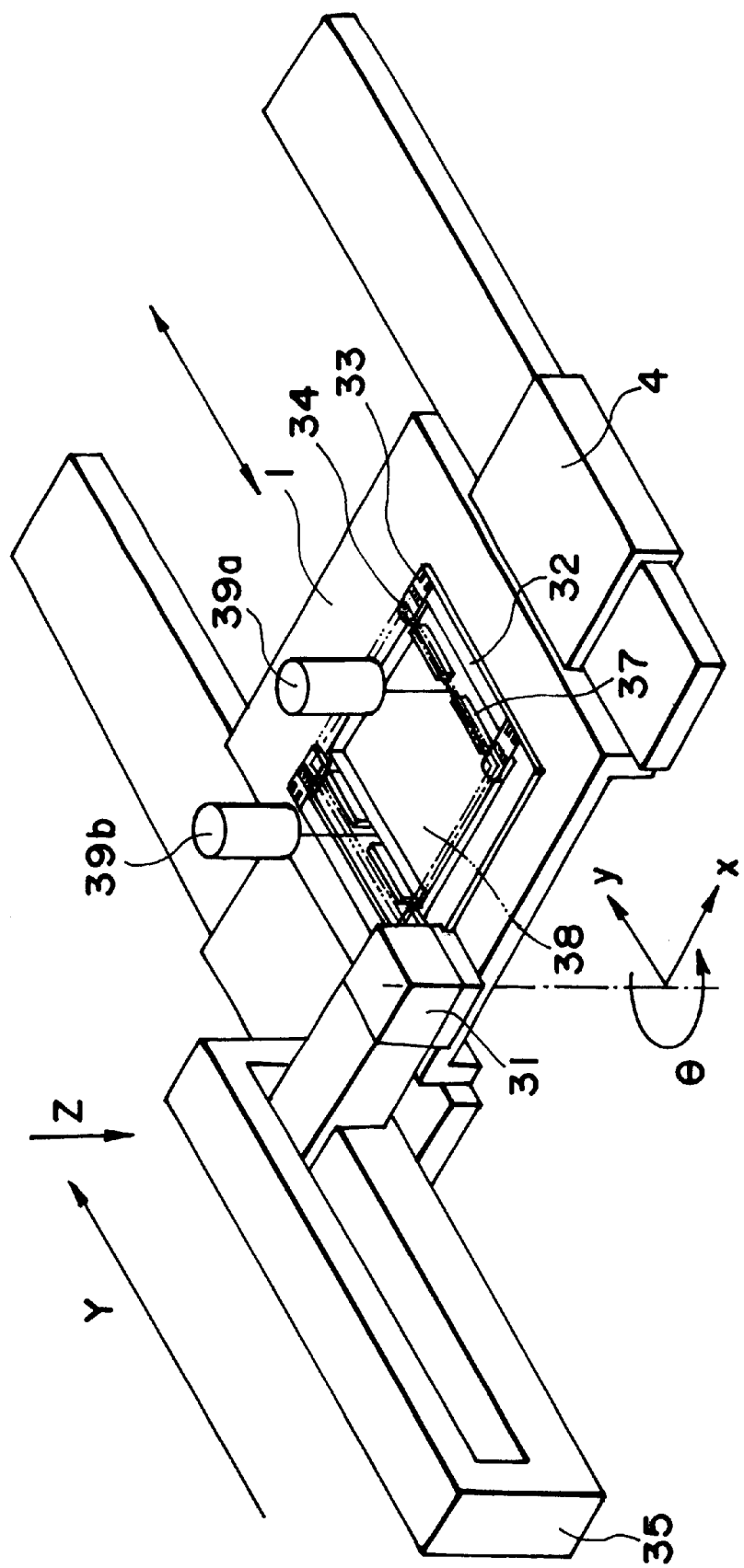
FIG. 4 is a schematic and perspective view for explaining the conveying hand mechanism at a substrate transfer position.

FIGS. 3 and 4 show a substrate conveying device. The conveying device illustrated is used in the apparatus of FIG. 1 as a reticle hand mechanism for replacement of reticles to be mounted on the reticle stage.

In FIGS. 3 and 4, denoted at 1 is an exposure stage (reticle stage), and denoted at 4 is an exposure stage actuator (linear motor). Denoted at 30 is a conveying hand, and denoted at 31 is an X-Y plane fine motion mechanism. Denoted at 32 is a conveying hand main body, and denoted at 33 is a leaf spring. Denoted at 34 is a substrate attracting portion, and denoted at 35 is a substrate conveying mechanism portion. Denoted at 37 is an air pad, and denoted at 38 is a substrate (reticle). Denoted at 39a and 39b are substrate position detecting microscopes (reticle alignment scopes).

Figure 5:
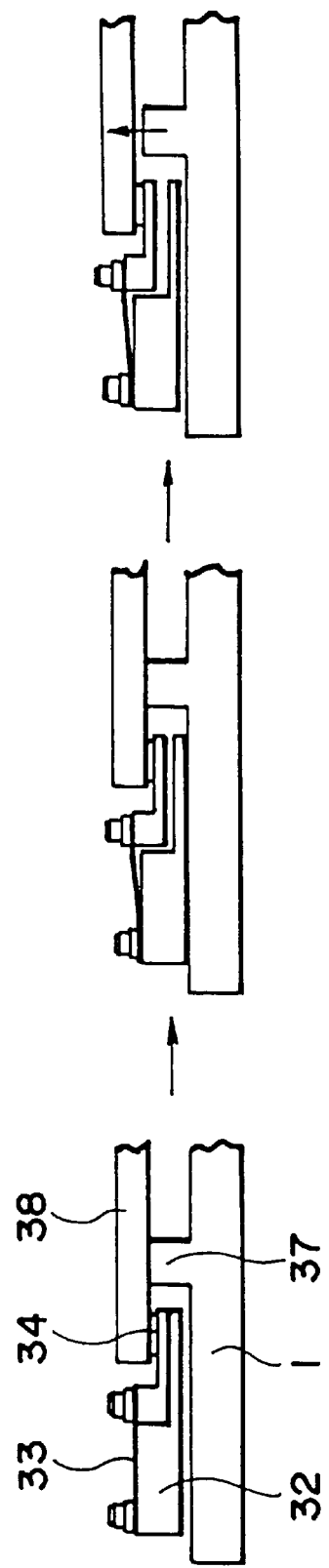
FIGS. 5(a), 5(b), and 5(c) are schematic views for explaining details of the hand mechanism of FIG. 4.

For substrate replacement, a fresh substrate 38 is put on the conveying hand 30, within a reticle library (not shown), for example. At the substrate attracting portion 34, the substrate is held by attraction and, in this state, it is conveyed to the position shown in FIG. 3 together with the substrate conveying mechanism portion 35. Subsequently, the conveying hand 30 is conveyed by means of Y and Z mechanisms of the substrate conveying mechanism portion 35, to the position shown in FIG. 4, horizontally (Y direction) and perpendicularly (Z direction). At the position shown in FIG. 4, the Z mechanism of the substrate conveying mechanism portion 35 moves down to the position whereat the substrate 38 contacts the air pad 37 on the exposure stage 1 (position in FIG. 5(a)). After this, the Z mechanism further moves down by a small amount, to cause flexure of the leaf spring 33, supporting the substrate 38 (position in FIG. 5(b)). Then, air is discharged from the air pad 37 and, with the air flow, the substrate 38 is floated from the air pad 37 by a small amount (position in FIG. 5(c)).

In this state, any positional error of the substrate 38 with respect to the exposure stage 1 is detected by use of the substrate position detecting microscopes 39a and 39b. While the substrate 38 is floating from the air pad 37, the amount of floating is small (e.g., 2 to several microns), less than the depth of focus (e.g., ten microns) of the substrate position detecting microscopes 39a and 39b. Thus, positional deviation can be detected with sufficient precision.

Subsequently, on the basis of the value detected, the X-Y plane fine motion mechanism 31 is used to move and position the conveying hand main body 32 along the X-Y plane, so that marks of the substrate 38 come to the measurement centers of the microscopes 39a and 39b. After the positioning is completed, the flow of air from the air pad 37 is stopped, and the substrate 38 positioned with respect to the exposure stage 1 is placed thereon. After this, a negative pressure is applied to the air pad 37 to produce suction of air, by which the substrate 38 is vacuum attracted and fixed to the exposure stage 1. On the other hand, vacuum attraction of the substrate attracting portion 34 of the conveying hand mechanism 30 is released, and the substrate 38 disengages from the conveying hand 30. Thus, conveyance is completed. After completion of conveyance, by using microscopes 39a and 39b a positional error between alignment marks formed on the substrate 38 and alignment marks formed on the exposure stage 1 is measured. In accordance with the thus measured value, values of X, Y and θ of the wafer on the wafer stage 3 are set, and the scan exposure operation is then performed.

For detection of positional deviation described above, first the surface of the substrate 38 is observed through the microscopes 39a and 39b. If the alignment marks of the substrate 38 are within the measurement ranges of the microscopes 39a and 39b, the positioning operation described above may not be done while the air flow of the air pad 37 may be changed to vacuum attraction and the vacuum attraction of the substrate attracting portion 34 may be stopped to complete conveyance of the substrate 38. Further, if the marks of the substrate 38 are not within the measurement ranges of the microscopes 39a and 39b but they are within the view fields of the microscopes, the positional deviation of the substrate 38 may be detected without changing the magnification of the microscopes 39a and 39b. If the marks of the substrate 38 are not within the view fields of the microscopes 39a and 39b, the magnification of them may be changed to a lower magnification to enlarge the view field, and positional deviation of the substrate 38 may be detected.

In accordance with this embodiment of the present invention, the conveying hand mechanism side is equipped with an X-Y-θ fine motion mechanism. This eliminates the necessity of provision of a fine motion mechanism on the movable stage. Thus, the weight of the movable stage such as the exposure stage can be reduced. The movement speed of the stage can therefore be increased, and the throughput can be improved. Further, flexure of the stage base or the like due to the weight of the stage can be reduced, and the exposure precision can be enhanced.

Additionally, when the substrate attracting portion of the hand is supported resiliently, use of fine-motion Z mechanism becomes unnecessary, and quick positioning is attainable.

[Embodiment 2]

Another embodiment of the present invention will be described below. An exposure apparatus according to this embodiment may have a general structure similar to that having been described with reference to FIGS. 1 and 2.

In operation of the exposure apparatus of this embodiment, for reticle replacement, the reticle stage 1 moves to a reticle replacement position outside the exposure region. It receives a reticle from a reticle changer, not shown. By means of a vacuum attraction pad, the received reticle is held on the reticle stage 1. Then, the reticle stage 1 moves to a reticle alignment position, and reticle alignment operation is made. For this reticle alignment, a reticle handler (not shown) moves down onto the reticle stage 1 to grasp the reticle, and a reticle alignment stage (not shown) is driven to move and position the reticle with respect to a reference mark provided on the reticle stage 1. A vacuum attraction pad is attached to the lower end of the reticle handler with intervention of a leaf spring, such that for the alignment the reticle is held by the vacuum pad. Also, air flows out of the vacuum pad of the reticle stage 1, and the reticle is floated from the reticle stage 1. In this state, the reticle alignment stage is driven.

Figure 6:
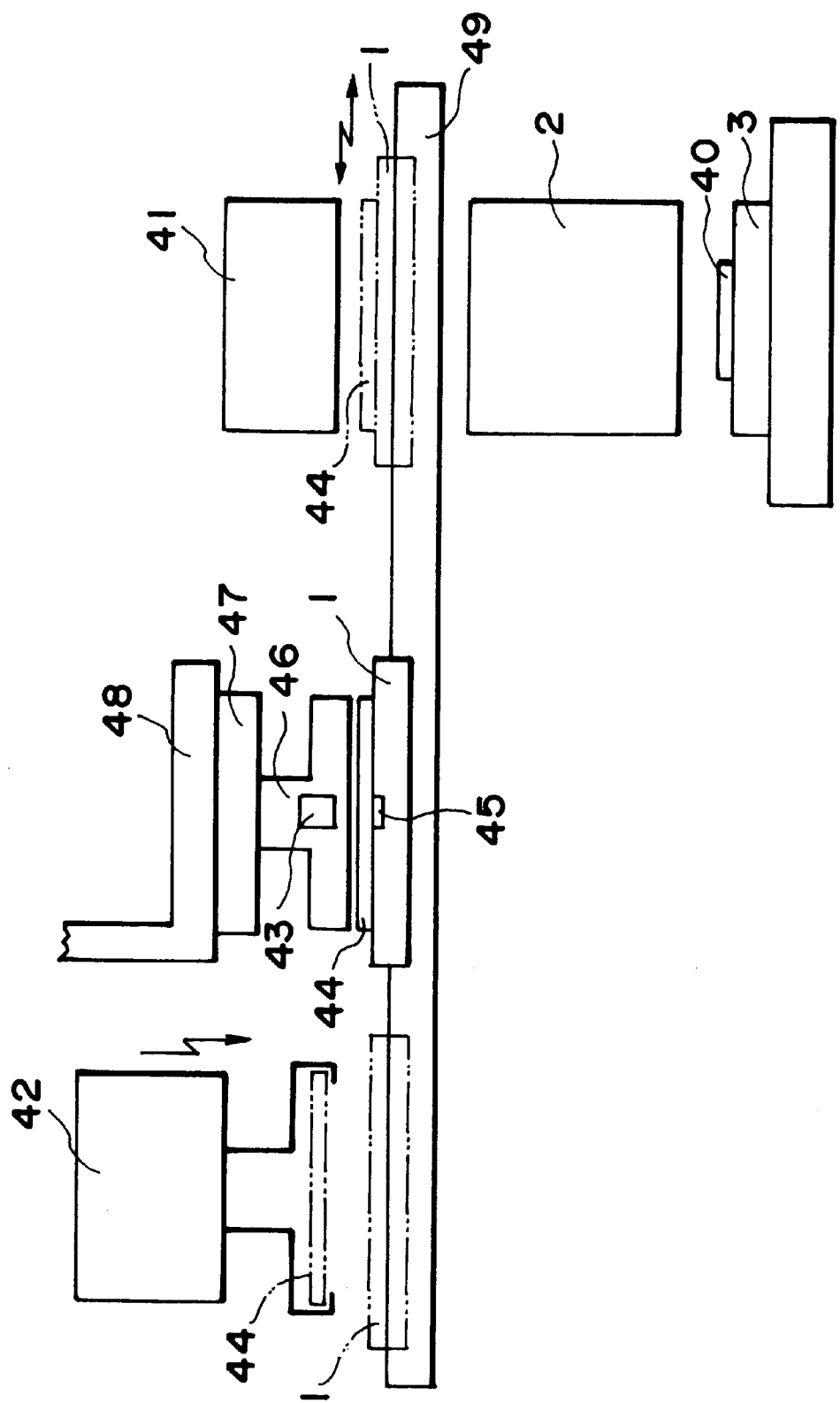
FIG. 6 is a schematic view of a reticle alignment mechanism of the exposure apparatus of the FIG. 1 embodiment.

FIG. 6 illustrates the structure of the reticle alignment mechanism of the exposure apparatus of this embodiment. In the illustrated structure, the reticle alignment mechanism is not mounted on the reticle stage, but it is disposed separately from the reticle stage. This results in lightened weight of the reticle stage as well as increased scan speed and increased throughput. In the structure of FIG. 6, denoted at I is the reticle stage which is illustrated by solid lines when it is at the reticle alignment position, and which is illustrated by dash-and-dot lines when it is at the reticle replacement position (leftward position in the drawing) or at the exposure region (rightward position in the drawing). Denoted at 2 is a projection optical system (projection lens), and denoted at 3 is a wafer stage. Denoted at 41 is an illumination optical system, and denoted at 42 is a reticle changer. Denoted at 43 is a substrate position detecting microscope (reticle alignment scope), and denoted at 44 is a reticle. Denoted at 45 is a reference mark which is provided on the reticle stage 1, and denoted at 46 is a reticle handler. Denoted at 47 is a reticle alignment stage, and denoted at 48 is a reticle alignment stage supporting member. Denoted at 49 is a reticle stage guide, and denoted at 40 is a wafer.

Figure 8A:
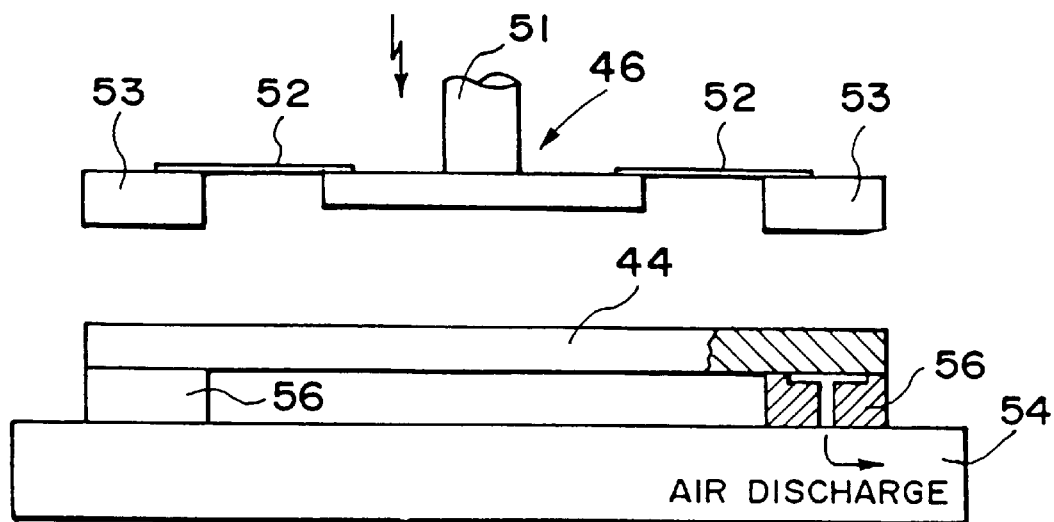
FIGS. 8(a), 8(b), and 8(c) are schematic views for explaining details of a reticle alignment procedure in FIG. 7.
Figure 8B:
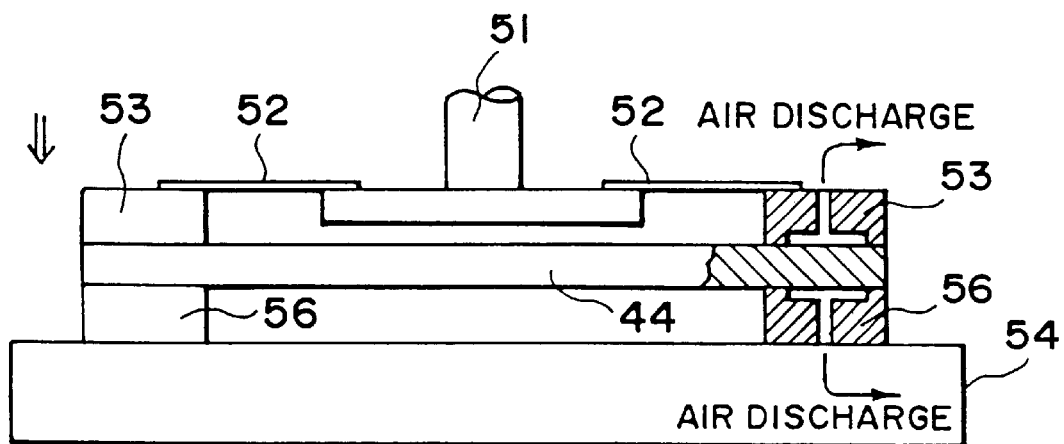
Figure 8C:
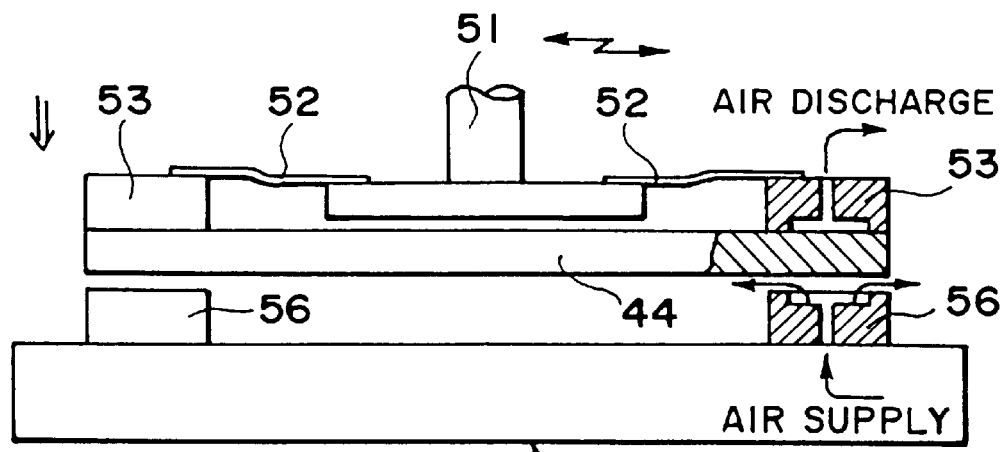

FIGS. 7(a) through 7(c) illustrate operations of various components during a reticle replacement operation and a reticle alignment operation. For the reticle replacement, the reticle stage 1 is moved to and placed at the reticle replacement position (position in FIG. 7(a)). Simultaneously, a fresh reticle 44 is conveyed from a reticle library (not shown) or the like by conveying means (not shown), and it is transferred to the reticle changer 42. The reticle changer 42 then puts the reticle on the reticle stage which is placed at the reticle replacement position. On the reticle stage 1, there is a reticle chuck air pad 56 such as shown in FIGS. 8(a) through 8(c), and the reticle 44 placed is vacuum attracted by the reticle chuck air pad 56 and it is held on the reticle stage 1. In FIG. 8, denoted at 54 is a reticle stage top plate.

For the reticle alignment operation, the reticle stage I moves to the reticle alignment position (position in FIG. 7(b)). FIGS. 8(a) through 8(c) illustrates details of the reticle alignment operation at this reticle alignment position. As the reticle stage 1 comes to the reticle alignment position (state in FIG. 8(a)), the reticle handler 46 moves down and the reticle 44 is vacuum attracted by a reticle attracting pad 53 (state in FIG. 8(b)) which is attached to the lower end of the lifting shaft 51 of the reticle handler 46. Then, vacuum attraction of the reticle chuck air pad 56 on the reticle stage 1 is changed to air blow, such that by the flow of air the reticle 44 is floated from the reticle chuck air pad 56 (state in FIG. 8(c)), by a small amount (if the depth of focus of the reticle alignment scope is 10 microns, for example, the amount of floating is about 2 to a few microns with which the reticle 44 can be held within the depth of focus).

In this state, any positional error of the reference mark 45 and an alignment mark (not shown) formed on the reticle 44 is detected by use of the reticle alignment scope 43. The reticle alignment stage 47 is then moved to correct the detected positional deviation. Further, the flow of air from the reticle chuck air pad 56 is turned off and vacuum supply is turned on, whereby the reticle 44 is vacuum attracted to the reticle chuck air pad 56. Subsequently, vacuum supply of the reticle attracting pad 53 of the reticle handler 46 is turned off, such that the alignment-completed reticle 44 is transferred to the reticle stage 1. The reticle handler 46 then moves upward (position in FIG. 7(c)). After completion of reticle alignment, by using the reticle alignment scope 43, a positional error between the alignment mark on the reticle 44 and the reference mark 45 the reticle stage 1 is measured. After this, in accordance with the thus measured value and with the remaining alignment error with the wafer, values of X, Y and θ of the wafer on the wafer stage 3 are set, and the scan exposure operation is then performed.

It is to be noted here that the reticle alignment operation may be done any time other than during the reticle replacement operation.

For detection of positional deviation described above, first, before moving the reticle handler 46 downward, the surface of the reticle 44 is observed through the reticle alignment scope 43. If the alignment mark of the reticle 44 is within the measurement range of the microscope 44, the above-described positional deviation measurement and scan exposure may be done without the positioning operation described above. If the alignment mark of the reticle 44 is not within the measurement range of the reticle alignment scope 43 but it is within the view field of the reticle alignment scope 43, the positional deviation of the reticle 44 may be detected without changing the magnification of the reticle alignment scope 43. If the alignment mark of the reticle 44 is not within the view field of the reticle alignment scope 43, the magnification of it may be changed to a lower magnification to enlarge the view field, and positional deviation of the alignment mark may be detected. The magnification change may be done in parallel to downward movement of the reticle handler 46. Also, after the magnification is changed, the magnification may be turned back in parallel to upward movement of the reticle handler 46.

In accordance with this embodiment of the present invention, the alignment mechanism for the original is not mounted on the original stage but it is disposed separately from the original stage. This results in lightened weight of the original stage as well as increased scan speed and increased throughput. Further, flexure of the stage base or the like due to the weight of the stage can be reduced, and the exposure precision can be enhanced.

Additionally, since the original attracting portion of the alignment mechanism is supported resiliently, a tolerance of error for the downward motion of the original attracting portion is enlarged. Thus, use of a fine-motion Z mechanism in the alignment mechanism becomes unnecessary, and quick positioning of the original is attainable.

[Embodiment 3]

Figure 9:
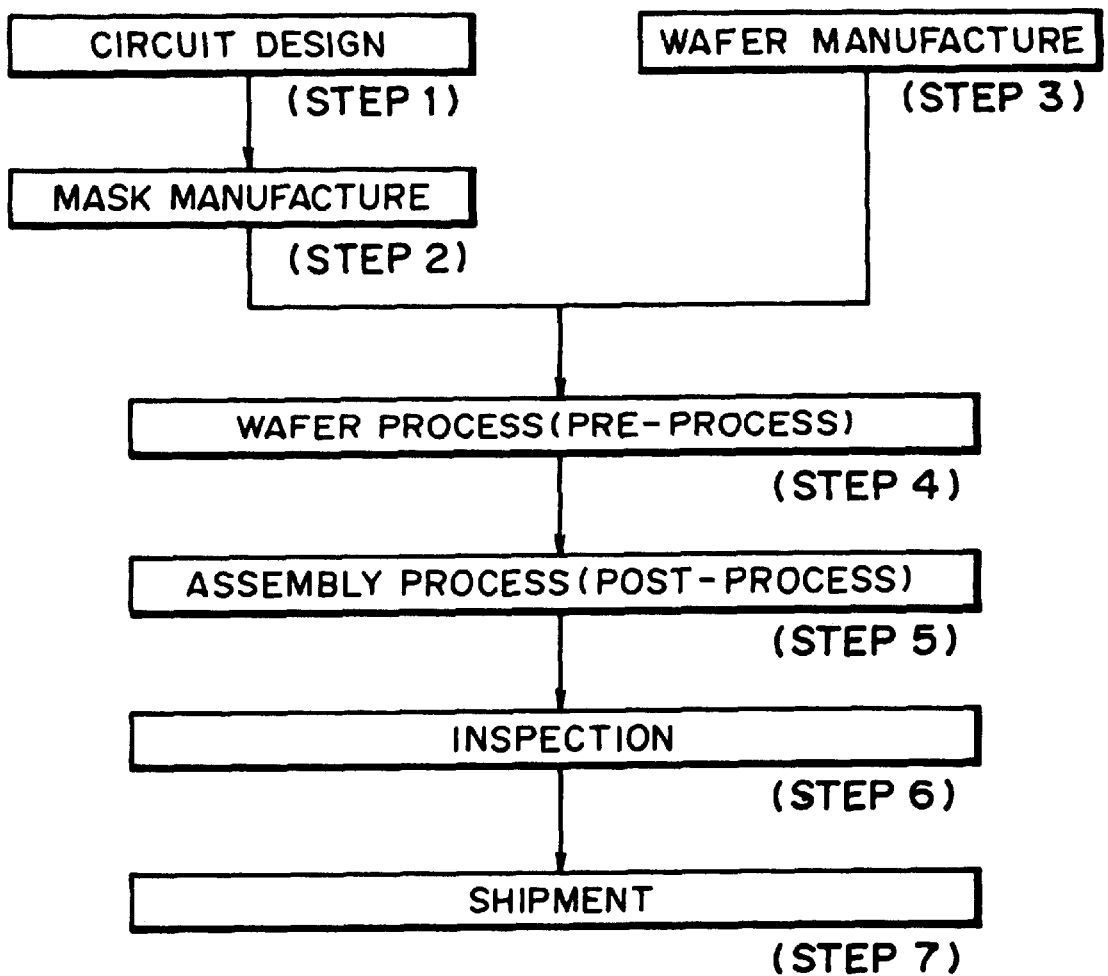
FIG. 9 is a flow chart of microdevice manufacturing processes.

FIG. 9 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 10:
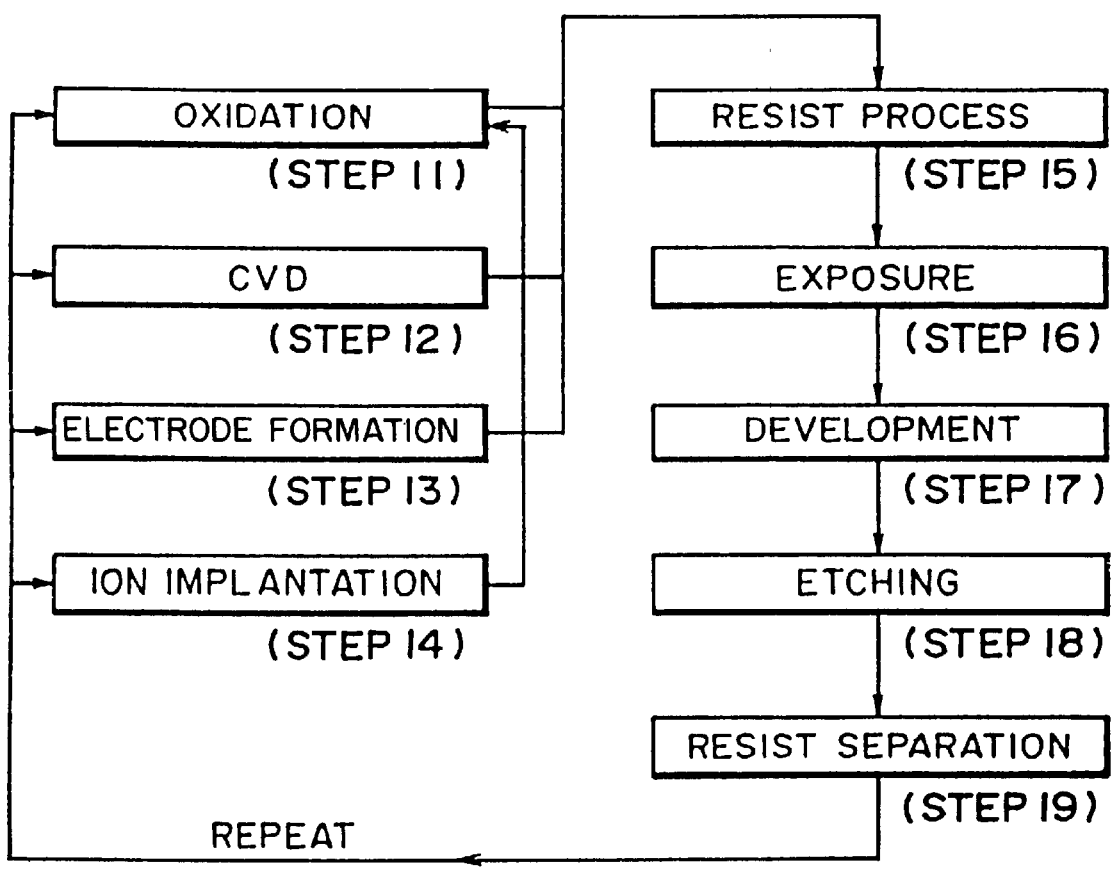
FIG. 10 is a flow chart for explaining details of a wafer process in the procedure of FIG. 9.

FIG. 10 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A substrate handling method, comprising:

holding a substrate with a hand mechanism, the hand mechanism being provided for positioning the substrate;

discharging a gas out of a gas pad provided on a stage, such that the substrate held by the hand mechanism is floated upon the gas pad, wherein the hand mechanism is provided separately from the stage;

detecting, with a detecting mechanism, the state of alignment of the substrate upon the stage, wherein the substrate is floated by the gas pad, within the range of a depth of focus of the detecting mechanism;

moving the hand mechanism such that the floated substrate is positioned finely relative to the stage; and stopping gas discharging from the gas pad.

2. A method according to claim 1, wherein said substrate holding step comprises contacting the substrate held by the hand mechanism to the gas pad.

3. A method according to claim 1, further comprising, after said gas stopping step, attracting and holding the substrate with the gas pad, with the gas being sucked through the gas pad.

4. A method according to claim 3, further comprising, after said gas stopping step, releasing the holding of the substrate with the hand mechanism.

5. A method according to claim 1, further comprising, after said gas stopping step, exposing the substrate with radiation.

6. A device manufacturing method for manufacturing a device with an exposure process including a method as recited in claim 5.

7. A method according to claim 1, wherein the substrate is a reticle for device manufacture and the stage is a reticle stage for supporting the reticle.

8. A method according to claim 7, further comprising performing the exposure of the reticle while the reticle is scanned.

9. A method according to claim 8, further comprising, after said gas stopping step, moving the reticle stage so that the positioned reticle is transferred to an exposure position where the scanning exposure is to be performed.

10. A substrate handling system, comprising:

a gas pad provided on a stage for holding a substrate with suction of a gas, said gas pad being able to provide gas suction and gas discharging, interchangeably;

a detecting mechanism for detecting the state of alignment of the substrate upon the stage, wherein the substrate is floated by the gas pad, within the range of a depth of focus of said detecting mechanism; and a hand mechanism, provided separately from the stage, for positioning the substrate floated upon said gas pad.

11. A system according to claim 10, wherein said detecting mechanism is mounted separately from the stage.

12. A system according to claim 10, wherein said hand mechanism comprises a movable portion being movable in a predetermined direction, and an attracting portion supported resiliently with respect to said movable portion, for holding the substrate with attraction.

13. A system according to claim 10, further comprising exposure means for exposing the substrate, held by said gas pad, with radiation.

14. A system according to claim 8, wherein the substrate is a reticle for device manufacture and the stage is a reticle stage for supporting the reticle.

15. A system according to claim 14, wherein said exposure means performs exposure of the reticle while the reticle is scanned.

16. A scan type exposure apparatus for scanningly transferring a pattern of a reticle onto a wafer, said apparatus comprising:

a projection system for projecting the reticle pattern onto the wafer;

a reticle stage for holding the reticle and for scanningly moving the reticle relative to said projection optical system, said reticle stage having a gas pad formed thereon for holding the reticle with suction of a gas, said gas pad being able to provide gas suction and gas discharging;

a detecting mechanism for detecting the state of alignment of the substrate upon the stage, wherein the substrate is floated by the gas pad, within the range of a depth of focus of said detecting mechanism;

a wafer stage for holding the wafer and for scanningly moving the wafer relative to said projection optical system; and an alignment system having a hand mechanism, for finely positioning, relative to said reticle stage, the reticle floating upon said gas pad as the gas pad discharges the gas.

17. An apparatus according to claim 16, wherein said alignment system is disposed separately from said reticle stage.

18. A scan type exposure apparatus for scanningly transferring a pattern of a reticle onto a wafer, said apparatus comprising:

a projection system for projecting the reticle pattern onto the wafer;

a reticle stage for holding the reticle and for scanningly moving the reticle relative to said projection optical system;

a wafer stage for holding the wafer and for scanningly moving the wafer relative to said projection optical system;

a gas pad provided on said reticle stage for holding the reticle with suction of a gas;

a detecting mechanism for detecting the state of alignment of the substrate upon the stage, wherein the substrate is floated by the gas pad, within the range of a depth of focus of said detecting mechanism; and an alignment system having a hand mechanism, for finely positioning the reticle on said reticle stage, said hand mechanism being disposed separately from said reticle stage, at a first position remote from a second position over the projection optical system where the scan exposure is performed, wherein said reticle stage is movable between the first and second positions.

19. An apparatus according to claim 18, wherein said reticle stage has a gas pad formed thereon, said gas pad being able to discharge a gas, and said hand mechanism is operable to position the reticle, which floats upon said gas pad as the gas pad discharges the gas.

* * * * *

UNITED STATES PATENT AND TRADEMARK OFFICE
CERTIFICATE OF CORRECTION

PATENT NO.    : 6,307,616 B1
DATED         : October 23, 2001
INVENTOR(S)   : Kenichiro Taji et al.

It is certified that error appears in the above-identified patent and that said Letters Patent is hereby corrected as shown below:

Column 1,
Line 13, "according" should read -- according to --.

Column 7,
Line 16, "illustrates" should read -- illustrate --.

Column 10,
Line 1, "claim 8," should read -- claim 10, --.
Line 7, "scan type" should read -- scan-type --.
Line 32, "scan type" should read -- scan-type --.

Signed and Sealed this

Twenty-fifth Day of June, 2002

Attest:

Attesting Officer

JAMES E. ROGAN
Director of the United States Patent and Trademark Office